United States Patent
Moriyama

(10) Patent No.: US 6,281,107 B1
(45) Date of Patent: Aug. 28, 2001

(54) SEMICONDUCTOR DEVICE AND METHOD FOR MANUFACTURING THE SAME

(75) Inventor: Yoshifumi Moriyama, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/506,013

(22) Filed: Feb. 17, 2000

Related U.S. Application Data

(62) Division of application No. 08/826,045, filed on Mar. 28, 1997, now Pat. No. 6,028,357.

(30) Foreign Application Priority Data

Mar. 28, 1996 (JP) .......................................... 8-74513

(51) Int. Cl.[7] .................................................. H01L 21/44
(52) U.S. Cl. ........................... 438/613; 438/612; 438/614
(58) Field of Search ..................................... 438/612, 613, 438/614, 615, 616, 617

(56) References Cited

U.S. PATENT DOCUMENTS

| | | | |
|---|---|---|---|
| 5,468,655 | 11/1995 | Greer | 257/738 |
| 5,547,530 * | 8/1996 | Nakamura et al. | 156/89.15 |
| 5,640,052 | 6/1997 | Tsukamoto | 257/738 |
| 5,747,101 * | 5/1998 | Booth et al. | 438/613 |

FOREIGN PATENT DOCUMENTS

| | | |
|---|---|---|
| 2-284426 | 11/1990 | (JP) . |
| 5-327202 | 12/1993 | (JP) . |

* cited by examiner

Primary Examiner—Kevin M. Picardat
(74) Attorney, Agent, or Firm—Foley & Lardner

(57) ABSTRACT

In a semiconductor device including a semiconductor device chip mounted on a substrate and a solder bump electrode formed on an electrode film of the substrate, a pillar-form conductive paste is formed on a first surface portion of the electrode film, and a solder bump electrode is formed to cover the pillar-form conductive paste and a second surface portion of the electrode film on which the pillar-form conductive paste is not formed. With this arrangement, it is possible to realize a predetermined bump height, and also to prevent a bump from collapsing at the time of mounting.

6 Claims, 2 Drawing Sheets

SEMICONDUCTOR DEVICE AND METHOD FOR MANUFACTURING THE SAME

This application is a divisional of application Ser. No. 08/826,045 filed Mar. 28, 1997, now U.S. Pat. No. 6,028,357.

BACKGROUND OF THE INVENTION

1. Field of the Invention

The present invention relates to a semiconductor device and a method for manufacturing the same, and more specifically to a semiconductor device having a semiconductor device chip mounted on a circuit substrate and encapsulated with resin, and a method for manufacturing the same.

2. Description of Related Art

In a prior art semiconductor device, a method has been performed in which a semiconductor device chip is mounted on one principal surface of a circuit substrate, and solder bump electrodes is formed on the other principal surface of the circuit substrate by locating a solder ball on electrodes formed on the other principal surface of the circuit substrate, and by reflowing the solder ball. This method is widely known as a BGA (Ball Grid Array). This package is attracting attention, since it has a construction fitted to a package required to have a number of electrodes.

In the case of forming the solder bump electrodes on the circuit substrate as an external electrodes of the package, since the solder bump electrode is required to have a height, a method of directly putting a solder ball on the electrodes of the circuit substrate has been performed in the prior art.

For example, Japanese Patent Application Pre-examination Publication No. JP-A-02-284426 discloses a method for forming a solder bump electrode on a predetermined electrode by means of a solder immersing method, although it relates to a semiconductor device chip itself.

As shown in FIG. 1, this prior art example is so constructed that an aluminum electrode 15 having poor solder wettability is formed on a silicon oxide film 14 formed on a silicon substrate 13, and a whole surface of the aluminum electrode 15 exposed within an opening formed in an insulator film 16 is covered with a conductive paste 17 having a solder wettability, and an assembly thus formed is immersed into a solder bath so that a solder bump electrode 18 is obtained.

Furthermore, Japanese Patent Application Pre-examination Publication No. JP-A-05-327202 discloses a method for forming a solder bump electrode by printing a solder paste on a predetermined electrode and shaping it by a reflowing.

In the prior art semiconductor device shown in FIG. 1, the conductive paste is formed on the whole surface of the aluminum electrode having poor solder wettability. The reason for this is that it is necessary to cover a large area with the conductive paste, since it is difficult to obtain a sufficient bond strength between a surface of the aluminum electrode and the conductive paste because an oxide film is formed on the surface of the aluminum electrode, and since it is also difficult to obtain a sufficient bond strength between the conductive paste and the solder because of a resin component included in the conductive paste.

In addition, the height of the solder bump electrode obtained by the solder immersing method is on the order 30 $\mu$m at maximum in the case of an electrode having one side length of 100 $\mu$m. This is effective in the case that the height of the solder bump electrode is not so required as in TAB (Tape Automated Bonding), but has become difficult to apply to a packaging for mounting on a printed circuit substrate. In the method for printing and reflowing the solder paste, on the other hand, it was difficult to obtain a sufficient bump height in comparison with the area in which the solder is printed.

SUMMARY OF THE INVENTION

Accordingly, it is an object of the present invention to provide a semiconductor device and a method for manufacturing the same, which have overcome the above mentioned defect of the prior art.

Another object of the present invention is to provide a semiconductor device and a method for manufacturing the same, capable of increasing the height of the solder bump electrode and also capable of uniformizing the height of the obtained solder bump electrodes.

Still another object of the present invention is to provide a semiconductor device and a method for manufacturing the same, capable of having an elevated reliability of connection after being mounted.

A further object of the present invention is to provide a semiconductor device and a method for manufacturing the same, capable of forming, in bundle, and at a low cost, bump electrodes having an elevated reliability of connection after being mounted.

A feature of the present invention lies in a semiconductor device including a semiconductor device chip mounted on a substrate and a solder bump electrode formed on an electrode film of the substrate, wherein the semiconductor device includes a conductive paste formed in the form of a pillar on a first surface portion of the electrode film, and a solder bump electrode formed to cover the pillar-form conductive paste and a second surface portion of the electrode film on which the pillar-form conductive paste is not formed. Here, it is preferred that the first surface portion is positioned on a center of the electrode film, and the second surface portion is positioned on a periphery of the electrode film. Furthermore, a surface of the electrode film is preferably plated with gold. In addition, a circuit element mounted on the substrate can be one or more electronic parts including the semiconductor device chip. Moreover, the conductive paste preferably includes a Cu powder as conductive filler.

Another feature of the present invention lies in a method for manufacturing a semiconductor device, comprising the steps of forming a conductive paste in the form of a pillar on a first surface portion of a whole surface of an electrode film on a substrate, by means of a printing method, and forming a solder bump electrode to cover the pillar-form conductive paste and a second surface portion of the electrode film on which the pillar-form conductive paste is not formed. Here, it is preferred that after the conductive paste is formed in the form of the pillar by means of the printing method, the pillar-form conductive paste is cured by a heat treatment. The solder bump electrode can be formed by printing a solder paste to cover the pillar-form conductive paste and the second surface portion of the electrode film on which the pillar-form conductive paste is not formed, and then, reflow-melting the printed solder paste. Alternatively, the solder bump electrode can be formed by a solder immersing method.

DESCRIPTION OF THE PREFERRED EMBODIMENTS

Figure 1:
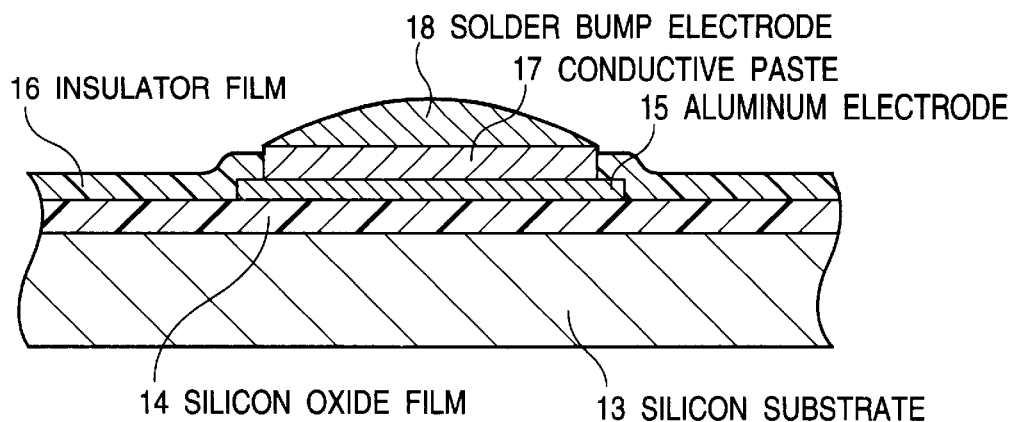
FIG. 1 is a diagrammatic sectional view of a prior art semiconductor device.
Figure 2A:
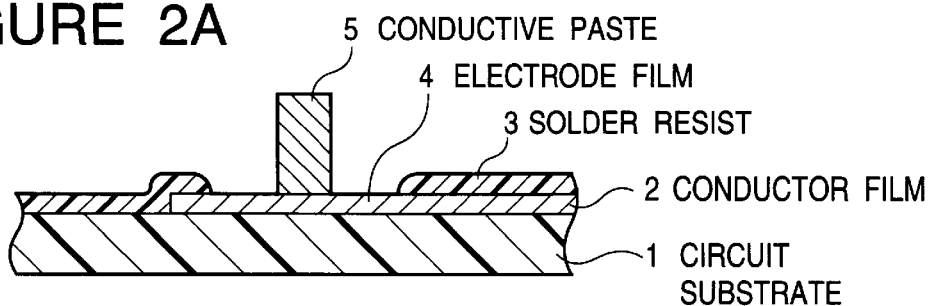
FIGS. 2A, 2B and 2C are diagrammatic sectional views of a semiconductor device, for illustrating a first embodiment of the method in accordance with the present invention for manufacturing the semiconductor device.
Figure 2B:
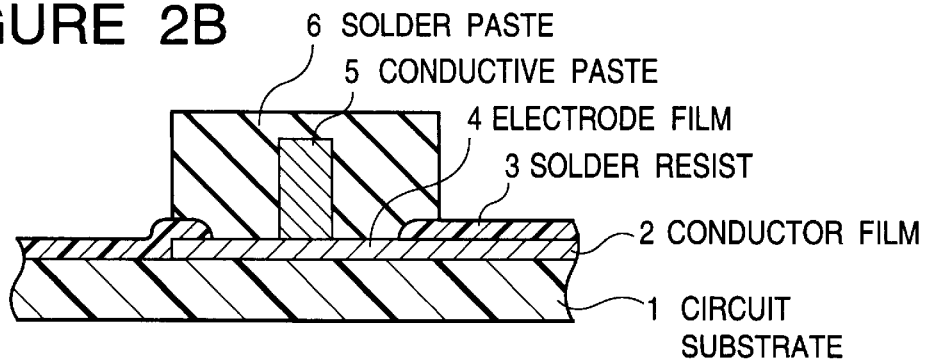
Figure 2C:
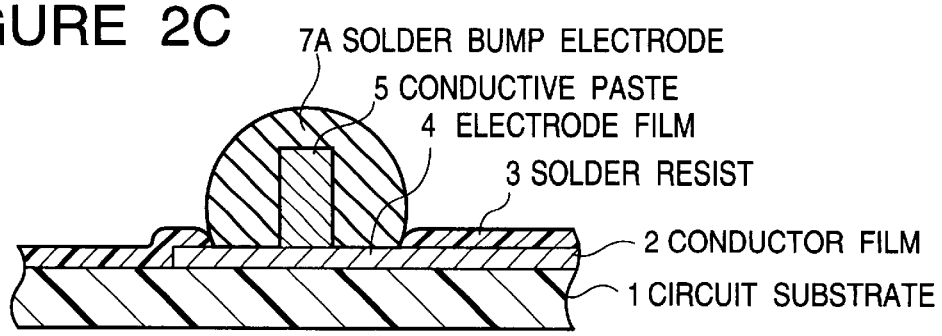

Now, embodiments of the semiconductor device in accordance with the present invention and the method in accordance with the present invention for manufacturing the semiconductor device will be described with reference to the accompanying drawings. FIGS. 2A, 2B and 2C are diagrammatic sectional views of a semiconductor device, for illustrating a first embodiment of the method in accordance with the present invention for manufacturing the semiconductor device.

First, as shown in FIG. 2A, a pattern of a conductor film 2 is formed on a first principal surface (upper surface in the drawing) of a circuit substrate 1, and the first principal surface of the circuit substrate 1 including the conductor film 2 is coated with a solder resist 3. An opening is formed in the solder resist 3, and a portion of the conductor film 2 exposed in the opening constitutes an electrode film 4, namely, an electrode pad. In general cases, this circuit substrate is a substrate constituting a package of the semiconductor device.

Although not shown in the drawing, one or more electronic components including a semiconductor device chip are mounted on a conductor film pattern in a second principal surface (lower surface in the drawing) of the circuit substrate, so that a circuit is constructed, and connected through a through hole and the conductor film 2 to the electrode film (electrode pad) 4. Alternatively, one or more electronic components including a semiconductor device chip are mounted on a conductor film pattern in a recess formed in the first principal surface of the circuit substrate, so that a circuit is constructed, and connected through the conductor film 2 to the electrode film (electrode pad) 4.

A conductive paste 5 is printed on the electrode film 4 formed of the conductor film 2, to form a projection 5 in the form of a pillar on a center of the electrode film 4, while maintaining a surface of a peripheral portion of the electrode film 4 in an exposed condition.

For example, when a printed circuit substrate is used as the circuit substrate 1, a surface of the conductor films 2 and 4 formed of copper or nickel is plated with gold. Namely, a surface treatment is carried out to obtain a surface having a good solder wettability and a good bonding property to the conductive paste.

Assuming that the size of the electrode film 4, namely, the size in a plan view of the opening of the solder resist 3, is 0.6 mm in diameter, the size in a plan view of the conductive paste 5 can be 0.25 mm in diameter, and the height of the conductive paste 5 can be on the order of 0.2 mm to 0.4 mm.

In ordinary cases, the pitch of the electrode films on the circuit substrate is on the order of 0.4 mm to 2.54 mm, and the diameter of the electrode film 4 is correspondingly on the order of 0.2 mm to 2.0 mm. Considering the fact that the diameter of the pillar-form conductive paste 5 is smaller than the diameter of the conductor film 4 and a mask patterning limit for printing the pillar-form conductive paste 5, it is preferred that the diameter of the pillar-form conductive paste 5 is in the range of 0.05 mm to 1.5 mm, and the height of the pillar-form conductive paste 5 is in the range of 0.03 mm to 1.0 mm.

The conductive paste includes copper powder as a conductive agent, and is cured at 150° C. for about 60 minutes. At this time, the curing is performed in an inert gas, so that a solder wettability can be ensured after curing. The shape and the size of the conductive paste can be changed depending upon the size of the substrate electrode, but it is required that a portion of the surface of the substrate electrode remains exposed.

More specifically, the conductive paste includes an electrolytic copper powder as a filler conductive agent, and a phenolic resin or epoxy resin as a binder, and has viscosity of 50 to 2000 P (poise). If necessary, anti-oxidant is added. The curing is performed at 150° C. for one hour to four hours.

Thereafter, as shown in FIG. 2B, a solder paste 6 is printed to cover the pillar-form conductive paste 5 and the electrode film 4 exposed in the opening on the substrate. In the case that the diameter of the electrode film 4 is on the order of 0.6 mm, the solder paste 6 is printed to have a diameter of 0.8 mm and a height of 0.5 mm to 0.8 mm.

For example, the solder paste is composed of solder particles formed of an alloy of Sn, Pb, Ag, In and/or Bi and having a particle diameter of 10 $\mu$m to 70 $\mu$m, the solder particles being mixed with a rosin flux or a water-soluble flux.

Then, as shown in FIG. 2C, the solder paste is reflowed and molten so that a solder bump electrode 7A is obtained. In the case of a eutectic solder (having a melting point of 183° C.), it is set that a substrate surface temperature becomes about 230° C.

In the reflow process of the solder paste, the flux which is one component of the solder paste is discharged so that the volume is reduced to for example 50% to 60%. However, since the solder paste internally includes the conductive paste cured in the form of the pillar, the solder bump electrode can ensure a constant height For example, in the case that, as mentioned above, the electrode film 4 has the diameter of 0.6 mm, the pillar-form conductive paste 5 has the diameter of 0.25 mm and the height of 0.25 mm, and the solder paste 6 has the diameter of 0.8 mm and the height of 0.8 mm, the solder bump electrode 7A is formed by reflow, to have a height of 0.4 mm and a bottom area of 0.6 mm in diameter to cover all the surface of the pillar-form conductive paste 5 and a whole surface of the peripheral portion of the electrode film 4.

Thus, the semiconductor device in accordance with the embodiment of the present invention is obtained.

Figure 3A:
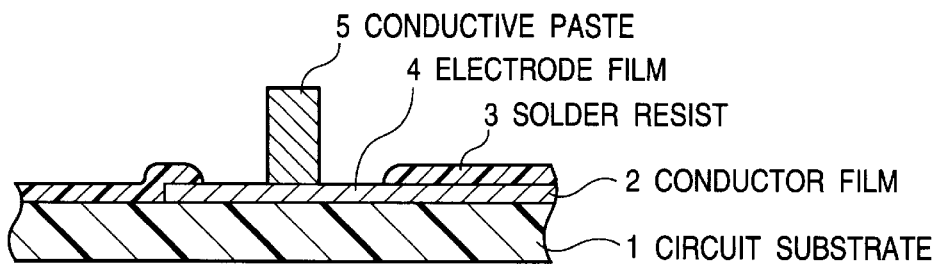
FIGS. 3A and 3B are diagrammatic sectional views of a semiconductor device, for illustrating a second embodiment of the method in accordance with the present invention for manufacturing the semiconductor device.
Figure 3B:
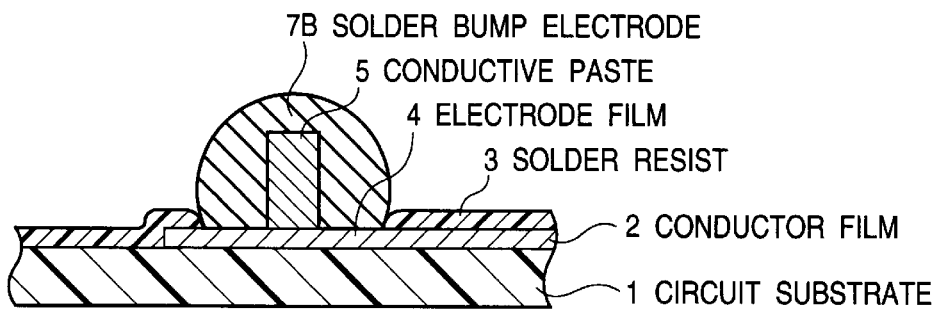

FIGS. 3A and 3B are diagrammatic sectional views for illustrating a second embodiment of the method in accordance with the present invention. In FIGS. 3A and 3B, elements corresponding or similar to those shown in FIGS. 2A to 2C given with the same Reference Numerals, and explanation thereof will be omitted for avoiding duplicate explanation.

In FIG. 3A, a pillar-form conductive paste 5 is formed, similarly to FIG. 2A.

In this embodiment, however, a solder bump electrode 7B is formed by a solder immersing method, as shown in FIG.

3B. Since the surface of the electrode film 3 exposed in the opening of the solder resist 3 and the surface of the pillar-form conductive paste 5 have solder wettability, the solder bump electrode 7B can be easily formed by the solder immersing method.

Figure 4:
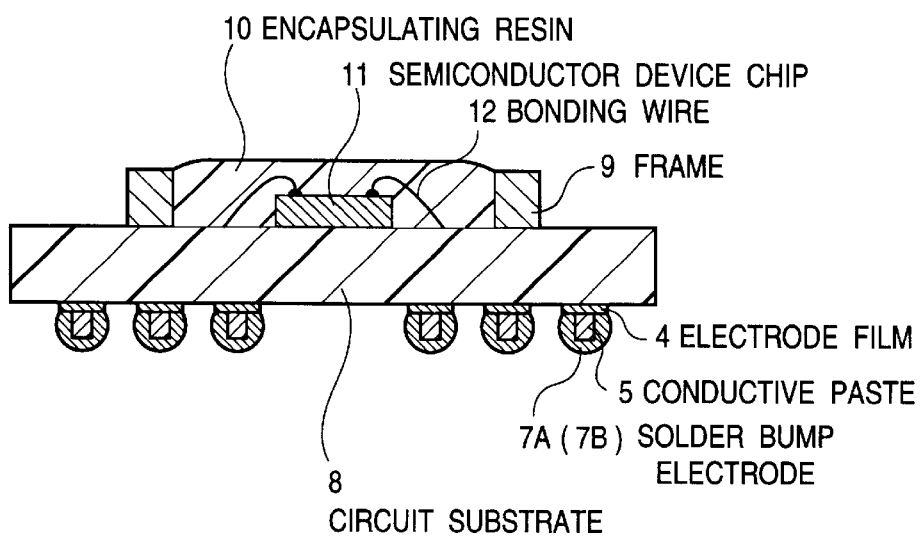
FIG. 4 is a diagrammatic sectional view of a semiconductor device package, for illustrating an example in which the semiconductor device in accordance with the present invention is applied to the package.

FIG. 4 is a diagrammatic sectional view for illustrating an example in which the semiconductor device in accordance with the first or second embodiment of the present invention is applied to the package for the semiconductor device. A semiconductor device chip 11 is mounted on one principal surface (upper surface in the drawing) of a circuit substrate 8, and electrodes on the semiconductor device chip 11 are connected to conductor film patterns of the circuit substrate by bonding wires 12. A encapsulating resin 10 is charged into the inside of a frame 9 so that the semiconductor device chip is encapsulated. Thereafter, by using the method as shown in FIGS. 2A to 2C or 3A and 3B, the pillar-form conductive paste 5 is formed on the center of the surface of the electrode film 4 which is formed on the other principal surface (lower surface in the drawing) of the circuit substrate 8 and which is electrically connected to the conductor film pattern on the one principal surface through a through hole. Furthermore, the solder bump electrode 7A (or 7B) is formed to wholly cover the conductive paste and the peripheral portion of the surface of the electrode film 4. Thus, the semiconductor device chip is packaged.

As seen from the above, according to the present invention, the pillar-form conductive paste is formed on the electrode film of the circuit substrate with a portion of the electrode film being maintained in an exposed condition, and a solder bump electrode is formed by the solder paste printing-reflowing method or the solder immersing method. With this arrangement, the height of the solder bump electrode can be elevated, and the height of the obtained solder bump electrodes is uniformized.

In addition, the package having the structure in accordance with the present invention can prevent a solder from collapsing at the time of mounting, so that it is possible to reduce inconvenience such as a short-circuiting by solder, and to elevate reliability of connection after mounted.

Furthermore, since the bump electrode can be formed by the solder paste printing or a solder immersing, bump electrodes can be formed in bundle at a low cost.

What is claimed is:

1. A method for manufacturing a semiconductor device, comprising the steps of:

forming a pillar-form conductive paste on a first portion of an electrode by a printing method, and forming a solder bump to cover said pillar-form conductive paste and a second portion of the electrode on which said pillar-form conductive paste is not formed by printing a solder paste to cover said pillar form conductive paste and said second portion of the electrode on which said pillar-form conductive paste is not formed, and then reflow-melting the printed solder paste.

2. A method for manufacturing a semiconductor device, claimed in claim 1, wherein after said conductive paste is formed in the form of a pillar by means of the printing method, said pillar-form conductive paste is cured by a heat treatment in an inert gas.

3. A method for manufacturing a semiconductor device, comprising the steps of:

forming a pillar-form conductive paste on a first portion of an electrode by a printing method, and forming a solder bump to cover said pillar-form conductive paste and a second portion of the electrode on which said pillar-form conductive paste is not formed by a solder immersing method.

4. The method claimed in claim 3, wherein after said conductive paste is formed in the form of a pillar by means of the printing method, said pillar-form conductive paste is cured by a heat treatment in an inert gas.

5. The method claimed in claim 3, wherein said conductive paste includes Cu powder as a conductive filler.

6. The method claimed in claim 1, wherein said conductive paste includes Cu powder as a conductive filler.

* * * * *